(12) United States Patent
Kimura

(10) Patent No.: US 7,112,818 B2
(45) Date of Patent: Sep. 26, 2006

(54) SEMICONDUCTOR FILM TRANSISTOR

(75) Inventor: Mutsumi Kimura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/058,116

(22) Filed: Jan. 29, 2002

(65) Prior Publication Data

US 2002/0125481 A1    Sep. 12, 2002

(30) Foreign Application Priority Data

Jan. 29, 2001   (JP)   ............... 2001-020697

(51) Int. Cl.
*H01L 29/78*    (2006.01)
(52) U.S. Cl. .............. 257/66; 257/57; 257/72
(58) Field of Classification Search .......... 257/57, 257/59, 66, 72
See application file for complete search history.

(56) References Cited

U.S. PATENT DOCUMENTS

| | | | |
|---|---|---|---|
| 5,124,769 A | 6/1992 | Tanaka et al. | |
| 5,492,843 A | 2/1996 | Adachi et al. | |
| 5,767,530 A | 6/1998 | Ha | |
| 5,962,897 A | 10/1999 | Takemura et al. | |
| 6,084,248 A * | 7/2000 | Inoue | 257/66 |
| 6,384,427 B1 * | 5/2002 | Yamazaki et al. | 257/72 |
| 6,399,988 B1 * | 6/2002 | Yamazaki | 257/72 |

FOREIGN PATENT DOCUMENTS

| | | |
|---|---|---|
| CN | 1366350 A | 8/2002 |
| JP | A-11-97699 | 4/1999 |
| JP | 2002-261292 | 9/2002 |
| KR | 1994-006707 B1 | 7/1994 |
| KR | 1995-4454 | 2/1995 |
| TW | 439294 | 6/2001 |

OTHER PUBLICATIONS

Matsumoto, Shoichi, "Liquid Crystal Display Technology", published by Sangyo Tosho (w/partial English-language translation).

* cited by examiner

*Primary Examiner*—Gene M. Munson
(74) *Attorney, Agent, or Firm*—Oliff & Berridge PLC

(57) ABSTRACT

In accordance with the invention, the width of a gate electrode is smaller than the width of the semiconductor film. A sub gate electrode connected to the gate electrode is disposed, at the gate electrode side of the semiconductor film, away from the semiconductor film more than gate electrode. The width of the sub gate electrodes is larger than the width of the semiconductor film. Ends of the semiconductor film have regions formed of an intrinsic semiconductor which is not doped with dopant. In a semiconductor device, this structure is suitable to reduce degradation over time which is caused by an increase of the electric field strength or the carrier concentration at the ends of the semiconductor film.

7 Claims, 12 Drawing Sheets

(a) PLAN VIEW (b) SECTIONAL VIEW PARALLEL TO CURRENT FLOW (c) SECTIONAL VIEW PERPENDICULAR TO CURRENT FLOW (a) PLAN VIEW (b) SECTIONAL VIEW PARALLEL TO CURRENT FLOW (c) SECTIONAL VIEW PERPENDICULAR TO CURRENT FLOW (a) ELECTRIC FIELD STRENGTH DISTRIBUTION (b) CARRIER CONCENTRATION DISTRIBUTION (a) PLAN VIEW (b) SECTIONAL VIEW PARALLEL TO CURRENT FLOW (c) SECTIONAL VIEW PERPENDICULAR TO CURRENT FLOW (a) ELECTRIC FIELD STRENGTH DISTRIBUTION (b) CARRIER CONCENTRATION DISTRIBUTION (a) PLAN VIEW (b) SECTIONAL VIEW PARALLEL TO CURRENT FLOW (c) SECTIONAL VIEW PERPENDICULAR TO CURRENT FLOW

SEMICONDUCTOR FILM TRANSISTOR

BACKGROUND OF THE INVENTION

1. Field of Invention

The present invention relates to semiconductor devices, and more particularly to a semiconductor device, an electro-optical device, and an electronic apparatus in which degradation in performance over time can be reduced, minimized or prevented.

2. Description of Related Art

FIGS. 1(a)–1(c) show a thin-film transistor as an example of a conventional semiconductor device. FIG. 1(a) is a plan view of a conventional polycrystalline-silicon thin-film transistor, FIG. 1(b) is a sectional view taken along plane b—b in the plan view of FIG. 1(a), and FIG. 1(c) is a sectional view taken along the plane c—c in the plan view of FIG. 1(a). As shown in FIGS. 1(a)–1(c), the polycrystalline-silicon thin-film transistor generally has a top gate structure, as disclosed in Liquid Crystal Display Technology written and edited by Shoichi Matsumoto, published by Sangyo Tosho.

FIGS. 2(a)–2(c) show a manufacturing process of a typical polycrystalline-silicon thin-film transistor. First, an amorphous silicon layer is formed on a glass substrate 51 by PECVD using $SiH_4$ or LPCVD using $Si_2H_6$, as shown in FIG. 2(a). The amorphous silicon layer is recrystallized by radiating with, for example, an excimer laser or by solid-phase growth to form a polycrystalline silicon layer 52. Next, as shown in FIG. 2(b), the polycrystalline silicon layer 52 is patterned so as to have an island shape, and then is provided with a gate insulating film 53 thereon. Subsequently, a gate electrode 54 is formed by deposition and patterning. Next, as shown in FIG. 2(c), a dopant, such as phosphorous or boron, is implanted into the polycrystalline silicon layer 52 by self-aligning using the gate electrode 54. Subsequently, the polycrystalline silicon layer 52 is activated, and thus source/drain regions 55, which have a CMOS structure, are formed. Following the formation of an interlayer insulating film 56 and a contact hole, source/drain electrodes 57 are formed by deposition and patterning.

Conventional semiconductor devices, such as MOS elements, have had a problem in that their performance deteriorates over time while the devices are operated for a long time. It is thought that this degradation over time is caused by an electric field concentrated at, for example, ends of a semiconductor film serving as an active layer, or at an interface between the semiconductor film and an insulating layer. The degradation over time arising from this cause is significant in some semiconductor devices, such as thin-film transistors, which include a thin semiconductor film serving as an active layer on the insulating layer.

In the thin-film transistor, since an electric field is concentrated at the ends of the semiconductor film, the electric field strength increases. In addition, since the thickness of the semiconductor film is small, the carrier concentration is liable to increase.

FIGS. 3(a) and 3(b) show results of distribution analyses, by device simulation, of the electric field strength and the carrier concentration of the polycrystalline silicon thin-film transistors. The electric field strength distribution in FIG. 3(a) shows that a substantially central area of the semiconductor film had an electric field strength of $4.5 \times 10^5$ V/cm, and that a far end of the semiconductor film had a high electric field strength of $6.6 \times 10^5$ V/cm. Also, FIG. 3(b) shows that the substantially central area of the semiconductor film had a carrier concentration of $2.7 \times 10^{17}$ $cm^{-3}$, and that the far end of the semiconductor film had a carrier concentration of $1.6 \times 10^{20}$ $cm^{-3}$.

SUMMARY OF THE INVENTION

Accordingly, the present invention reduces the electric field strength or the carrier concentration at ends of a semiconductor film, and thus provides a semiconductor device in which degradation in performance of the device over time can be reduced, minimized or prevented.

A first semiconductor device of the present invention includes a semiconductor film, a gate insulating film formed on at least part of the semiconductor film, and a gate electrode formed on the gate insulating film. The gate electrode does not cover any end of the semiconductor film. In this structure, the ends of the semiconductor film may be the areas where the semiconductor film is in contact with a field insulator to separate elements.

A second semiconductor device of the present invention includes a semiconductor film having a source region and a drain region, a gate insulating film formed on at least part of the semiconductor film, and a gate electrode formed on the gate insulating film. The width of the gate electrode is smaller than the width of the semiconductor film. The widths of the semiconductor film and the gate electrode are defined as the lengths thereof in a direction that is perpendicular to a direction in which a current flows between the source region and the drain region. Hence, the semiconductor device has an external structure in which the semiconductor film extends past the gate electrode.

In the first and second semiconductor devices of the present invention, since the gate electrode does not overlie the ends of the semiconductor film, any electric concentration at the ends of the semiconductor film, which is one of the causes of degradation over time, can be reduced, minimized or prevented. These semiconductor devices, therefore, can maintain the original performance for a long time.

A third semiconductor device of the present invention further includes a sub gate electrode that is connected to the gate electrode in a semiconductor device described above.

In a fourth semiconductor device of the present invention, the sub gate electrode is disposed on the gate electrode.

Since the third and fourth semiconductor devices have the sub gate electrode, the carriers flowing in the semiconductor film can be precisely controlled.

In a fifth semiconductor device of the present invention, the sub gate electrode of a semiconductor device described above is disposed so as to cover ends of the semiconductor film. In this semiconductor device, since carrier control at the ends of the semiconductor film is performed by the sub gate electrode, the semiconductor device has a structure in which the electric field strength or the carrier concentration at the ends of the semiconductor film and the off-state current can be reduced at the same time. More preferably, the sub gate electrode not only covers the ends of the semiconductor film, but also extends past the semiconductor film.

A sixth semiconductor device of the present invention includes a semiconductor film, a gate insulating film formed on at least part of the semiconductor film, and a gate electrode formed on the gate insulating film. Ends of the semiconductor film include regions that are formed of an intrinsic semiconductor which is not doped with dopant. The regions formed of an intrinsic semiconductor at the ends of the semiconductor film of the semiconductor device contribute less to the transfer of carriers. Even if a high electric field strength or high carrier concentration is generated in the regions that are formed of an intrinsic semiconductor, therefore, degradation in performance over time can be reduced. In this specification, "a region formed of an intrinsic semiconductor which is not doped with dopant" means a semiconductor region which is doped with a smaller amount of dopant than the other semiconductor regions, as well as a region which is not doped with any dopant.

A seventh semiconductor device of the present invention includes a semiconductor film, a gate insulating film formed on at least part of the semiconductor film, and a gate electrode formed on the gate insulating film. The semiconductor film includes a region that is formed of an intrinsic semiconductor which is not doped with dopant, and the region extends past the gate electrode. This semiconductor device has a structure in which deterioration caused by heating the semiconductor film when the device is driven or when electric power is applied to the device, can be reduced, minimized or prevented. If the semiconductor device is used as a semiconductor device which is incorporated into, for example, shift registers, level shifters, buffer circuits, and analog switches, degradation of these circuits over time can be reduced.

An eighth semiconductor device of the present invention includes a semiconductor film having a source region and a drain region, a gate insulating film formed on at least part of the semiconductor film, and a gate electrode formed on the gate insulating film. The semiconductor film includes a region that is formed of an intrinsic semiconductor which is not doped with dopant, i.e., the region extending toward the source region or the drain region from the gate electrode. The thin-film transistors shown in FIGS. 7 and 8 are examples of this semiconductor device. These thin-film transistors have a structure in which heat generated in the semiconductor film can be efficiently released. If the thin-film transistors are used as a semiconductor device which is incorporated into circuits, such as shift registers, level shifters, buffer circuits, and analog switches, degradation of these circuits over time can be reduced.

A ninth semiconductor device of the present invention includes a semiconductor film having a source region and a drain region, a gate insulating film formed on at least part of the semiconductor film, and a gate electrode formed on the gate insulating film. The semiconductor film includes a plurality of regions formed of an intrinsic semiconductor which is not doped with dopant, and the regions extend toward the source region or the drain region. This semiconductor device has a structure in which a large current can be applied while inhibiting heat generation by the current.

In a tenth semiconductor device of the present invention, the semiconductor film of a semiconductor device described above is formed on an insulating layer. Thin-film transistors and SOI transistors are examples of the semiconductor devices. In a thin-film transistor, the insulating layer is separated by the ends of the semiconductor film. As a result, degradation in the performance of the device over time, which is due to a high electric field strength or carrier concentration at the ends of the semiconductor film, is significant especially in the thin-film transistor. However, the semiconductor device according to the present invention can maintain its original performance for a long time.

A circuit board of the present invention includes a semiconductor device described above, and wires that supply signals or electric power to the semiconductor device. This circuit board is suitable for electro-optical devices, such as liquid crystal devices and electroluminescence devices.

A first electro-optical device of the present invention includes the circuit board, a first electrode formed above the circuit board, and an electro-optical element formed above the first electrode.

A second electro optical device of the present invention includes an electro-optical element and a semiconductor device described above. The electro-optical element and the semiconductor device are used as at least one electronic circuit that is selected from the group consisting of shift registers, level shifters, buffer circuits, and analog switches.

In the electro-optical device, an organic electroluminescence element may be used as the electro-optical element.

In an electronic apparatus of the present invention, an electro-optical device described above is used as a display.

DETAILED DESCRIPTION OF PREFERRED EMBODIMENTS

Preferred embodiments of the invention are described below.

First Embodiment

Figure 1:
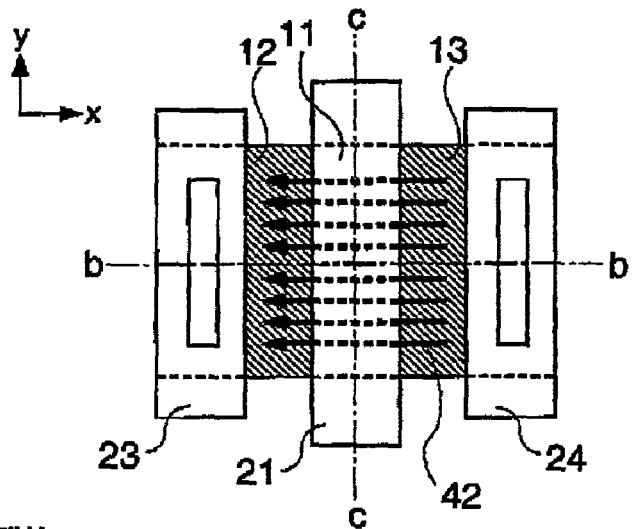
FIGS. 1(*a*) and 1(*c*) are a plan view, a sectional view taken along a plane parallel to a current flow, and a sectional view taken along a plane perpendicular to the current flow, of a conventional polycrystalline silicon thin-film transistor.
Figure 1:
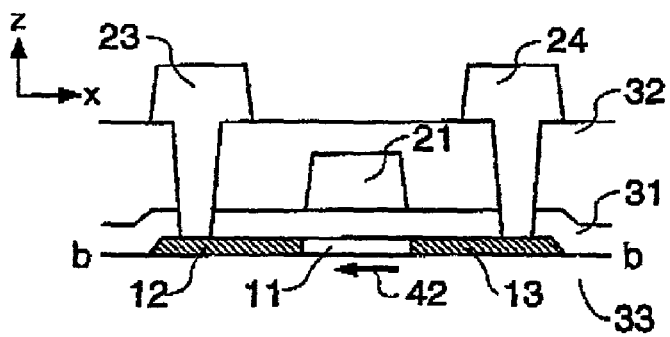
Figure 1:
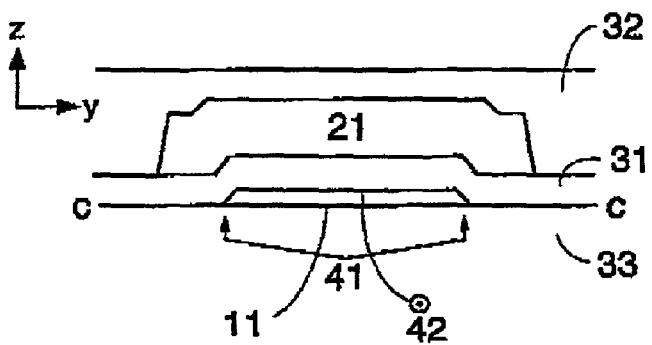
Figure 2:
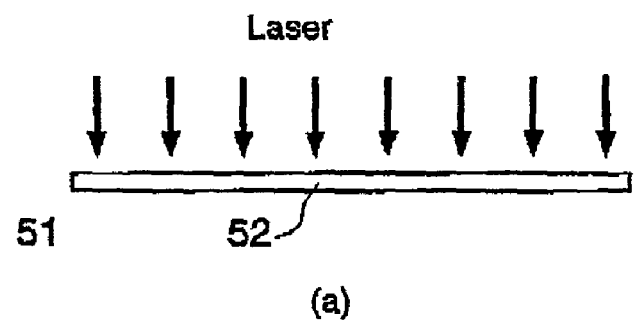
FIGS. 2(*a*)–2(*c*) show a manufacturing process of a conventional polycrystalline silicon thin-film transistor.
Figure 2:
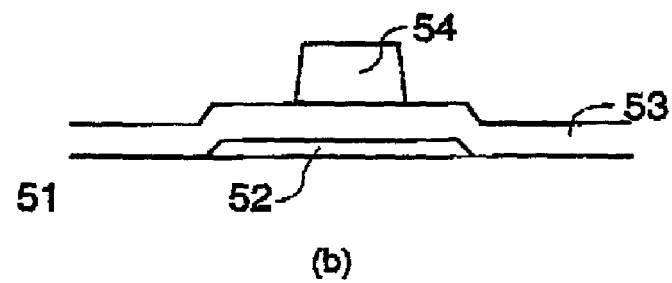
Figure 2:
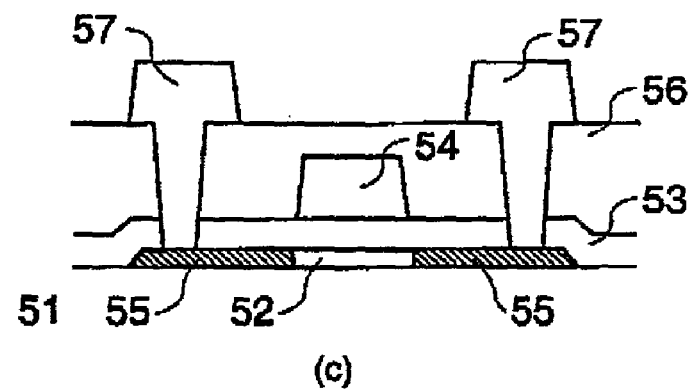
Figure 4:
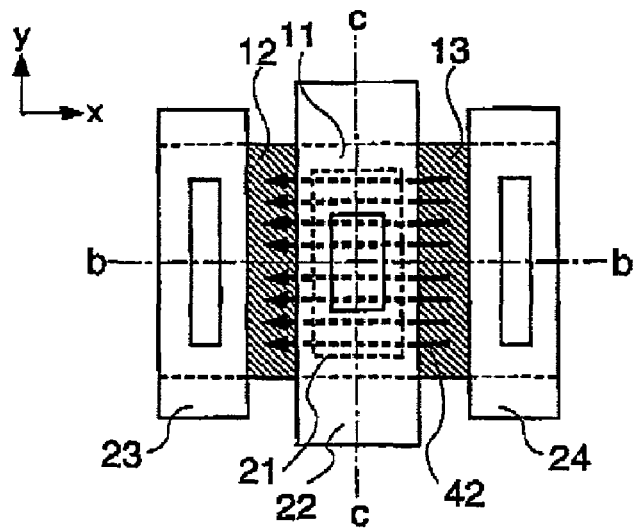
FIGS. 4(*a*)–4(*c*) are a plan view, a sectional view taken along a plane parallel to a current flow, and a sectional view taken along a plane perpendicular to the current flow, of a polycrystalline silicon thin-film transistor according to a first embodiment of the present invention.
Figure 4:
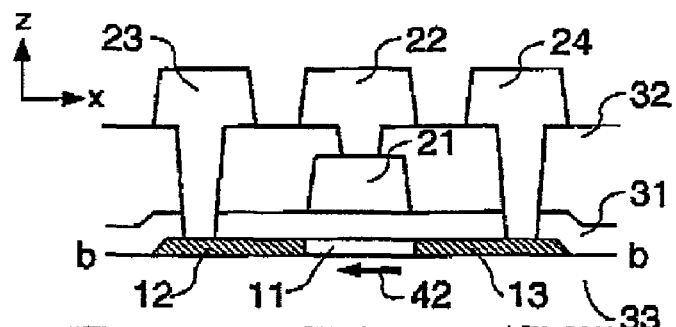
Figure 4:
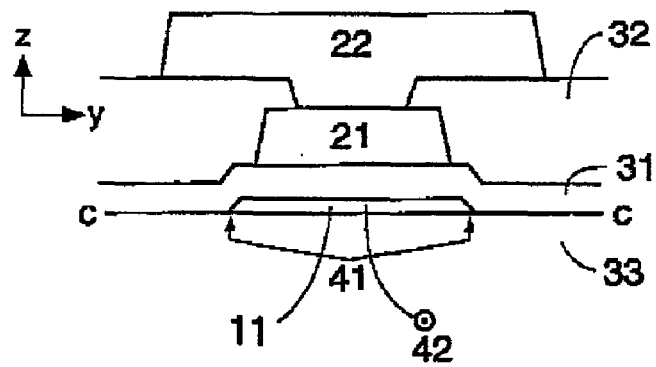

FIGS. 4(a)–4(c) are a schematic plan view and two sectional views of a thin-film transistor according to a first embodiment of the present invention. In the thin-film transistor, a semiconductor film formed of a highly-doped source region 12, a highly-doped drain region 13, and an active region 11 is formed of polycrystalline silicon. The thin-film transistor, basically, has the same structure as the conventional, typical thin-film transistor shown in FIG. 1. However, as shown in FIGS. 4(a)–4(c), a gate electrode 21 is disposed so as not to cover ends of the semiconductor film formed of the highly-doped source region 12, the highly-doped drain region 13, and the active region 11. Also, a sub gate electrode 22, connected with the gate electrode 21, is formed so as to extend past ends 41 of the semiconductor film.

Figure 3:
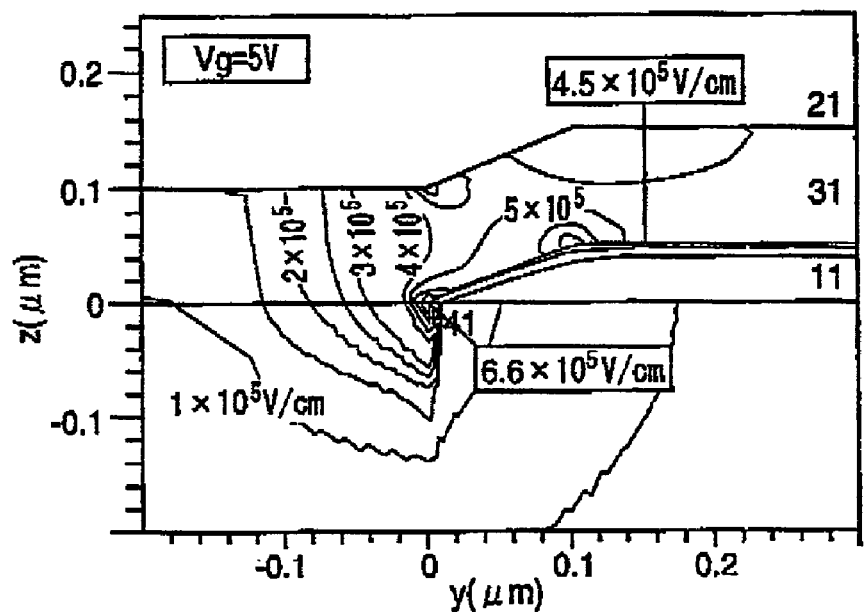
FIGS. 3(*a*) and 3(*b*) are distribution charts, by device simulation, of the electric field strength and the carrier concentration of a conventional polycrystalline silicon thin-film transistor.
Figure 3:
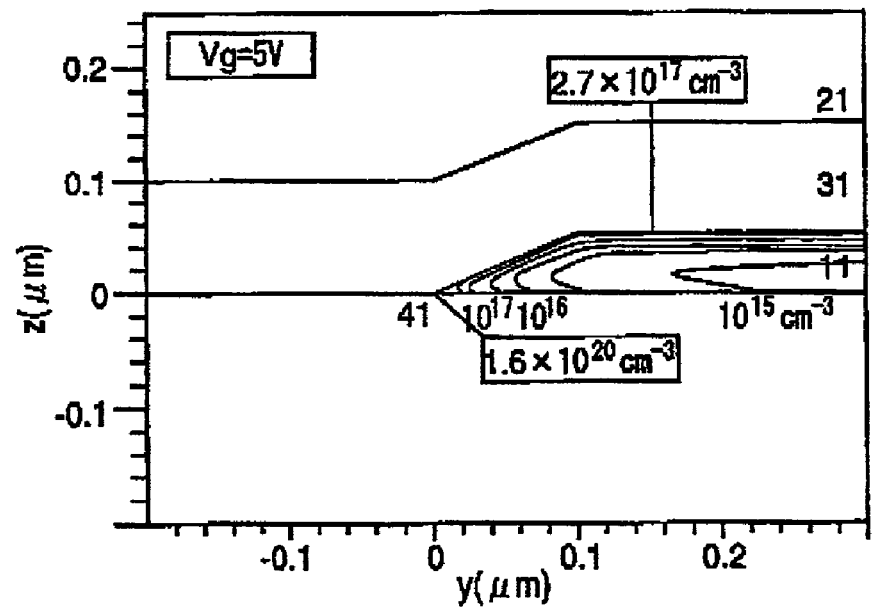
Figure 5:
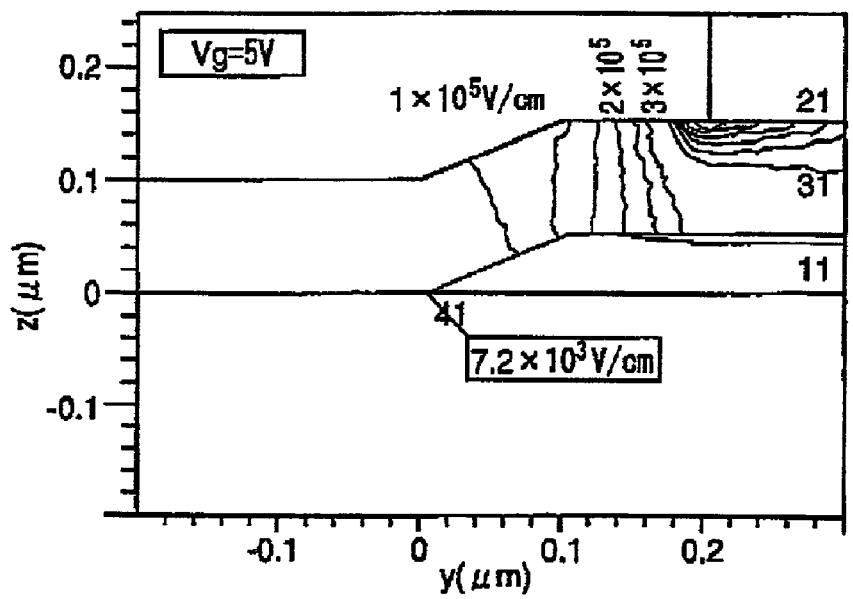
FIGS. 5(*a*) and 5(*b*) are distribution charts, by device simulation, of the electric field strength and the carrier concentration of the polycrystalline silicon thin-film transistor according to the first embodiment of the present invention.
Figure 5:
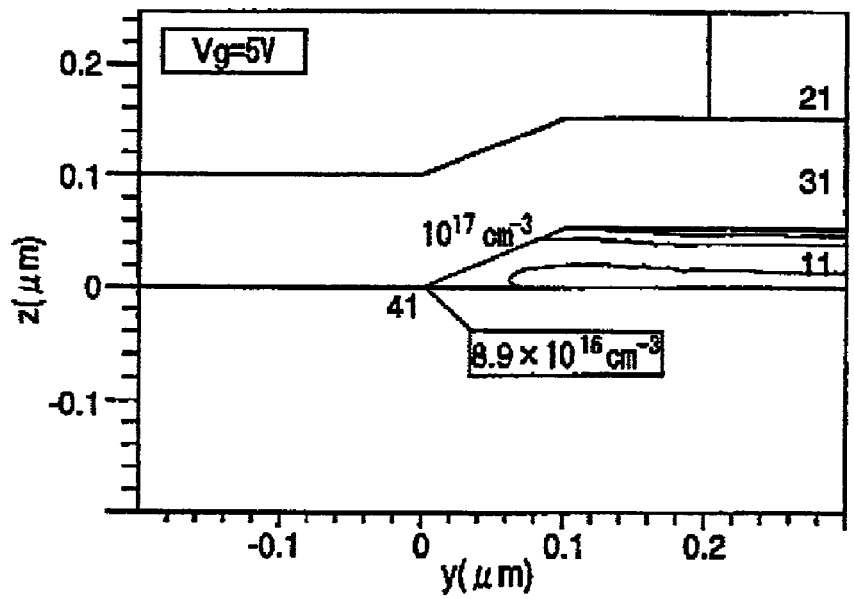

The distributions of the electric field strength and the carrier concentration of the thin-film transistor according to this embodiment were analyzed by device simulation, and the results are shown in FIGS. 5(a) and 5(b). This device simulation was performed only for the gate electrode 21, which directly affects the electric field of the semiconductor film, but not for the sub gate electrode 22, using the same parameters as in the above-described device simulation of the conventional thin-film transistor. The results of the device simulation of the conventional thin-film transistor, as shown in FIGS. 3(a) and 3(b), show that the electric field strength and the carrier concentration at an end of the thin-film transistor were $6.6 \times 10^5$ V/cm and $1.6 \times 10^{20}$ cm$^{-3}$, respectively. On the other hand, the results of the device simulation of the thin-film transistor according to this embodiment show that the electric field strength and the carrier concentration at an end of the thin-film transistor were $7.2 \times 10^3$ V/cm and $8.9 \times 10^{16}$ cm$^{-3}$, respectively. Hence, the electric field strength and the carrier concentration decreased significantly.

This suggests that the electric field strength and the carrier concentration at ends of the semiconductor can be reduced by disposing the gate electrode 21 so as not to cover the ends 41 of the semiconductor film.

The sub gate electrode 22 which extends past the semiconductor film formed of the highly-doped source region 12, the highly-doped drain region 13, and the active region 11 contributes particularly to the reduction of off-state current. More specifically, the sub gate electrode 22 prevents a leakage electric field from the vicinity thereof from reaching the ends of the semiconductor when the semiconductor is in an off state. Such minute leakage current often causes a problem. If the electric field is blocked, the potential gradient in the semiconductor film becomes close to zero, the carrier concentration decreases, the minute leakage current is reduced, and thus the off-state current can be reduced.

Second Embodiment

Figure 6:
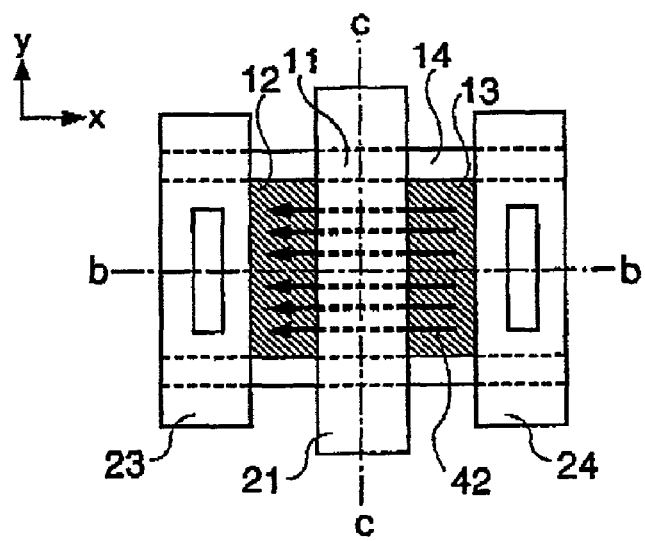
FIGS. 6(*a*)–6(*c*) are a plan view, a sectional view taken along a plane parallel to a current flow, and a sectional view taken along a plane perpendicular to the current flow, of a polycrystalline silicon thin-film transistor according to a second embodiment of the present invention.
Figure 6:
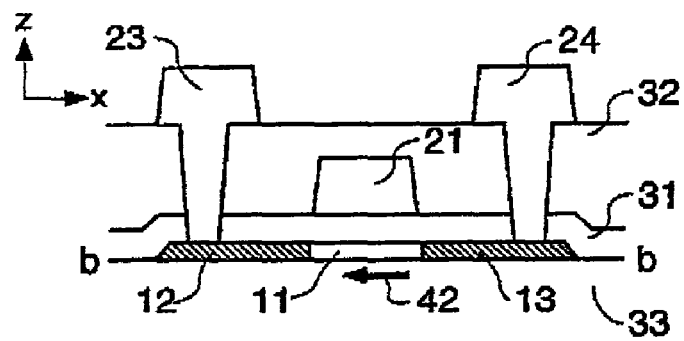
Figure 6:
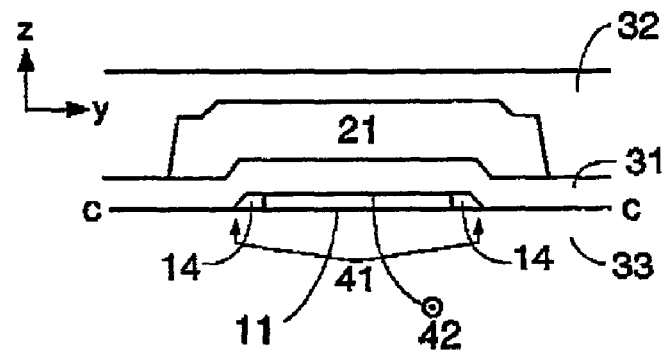

FIGS. 6(a)–6(c) are a schematic plan view and two sectional views of a thin-film transistor according to a second embodiment of the present invention. In the thin-film transistor, a semiconductor film formed of the highly-doped source region 12, the highly-doped drain region 13, and the active region 11 has an intrinsic-semiconductor region 14 at ends thereof. Since the intrinsic-semiconductor region 14 is not in the flow of current 42, deterioration in the performance of the device over time, which is due to a high electric field strength and a high carrier concentration, can be reduced even if the high electric field strength and the high carrier concentration occur in the intrinsic-semiconductor region 14.

Third Embodiment

Figure 7:
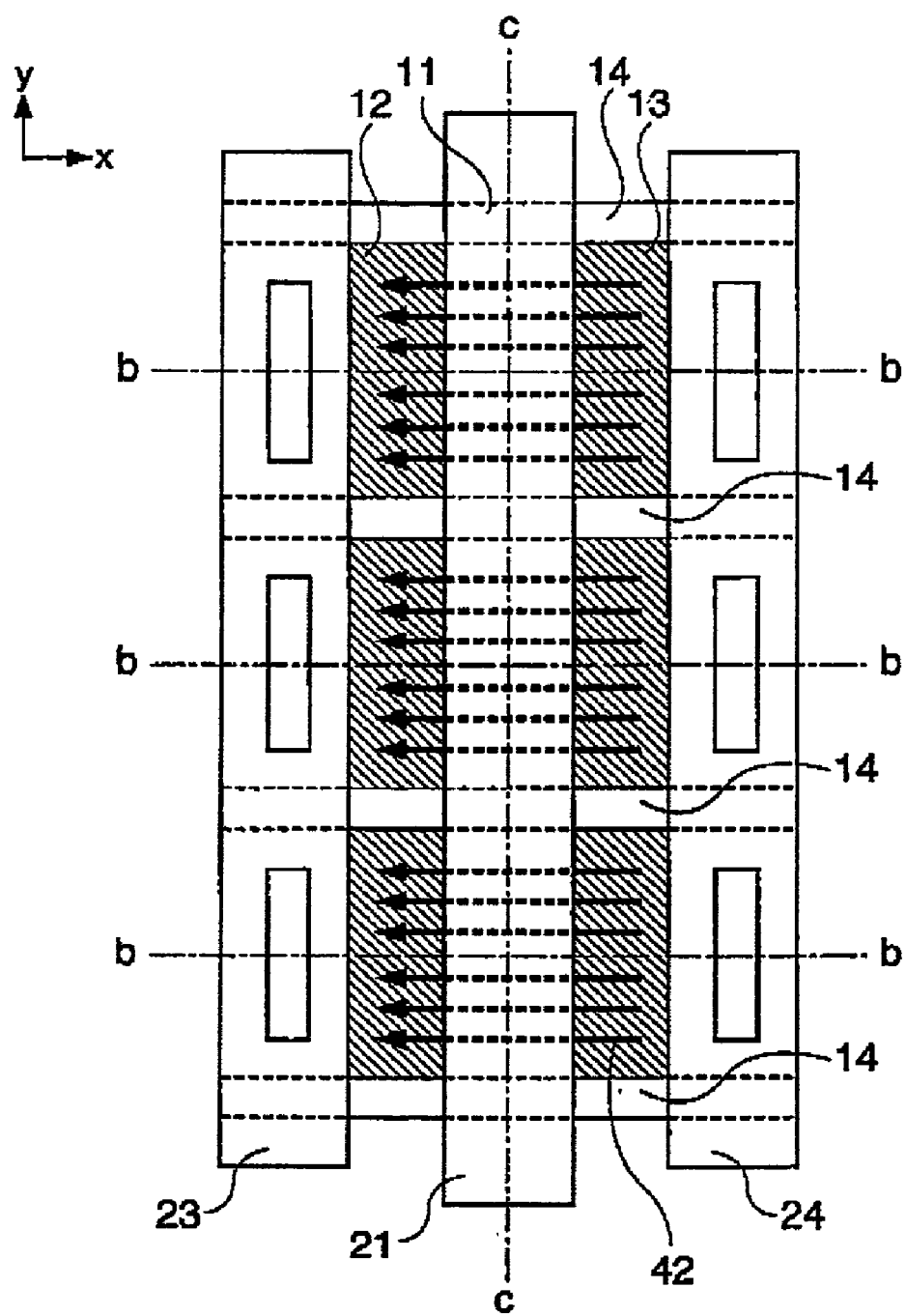
FIG. 7 is a plan view of a polycrystalline silicon thin-film transistor according to a third embodiment of the present invention.
Figure 8:
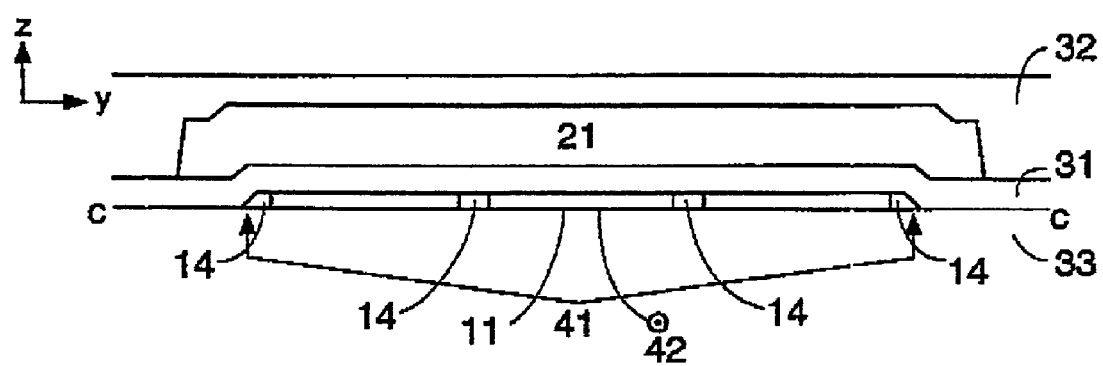
FIG. 8 is a sectional view of a polycrystalline silicon thin-film transistor according to the third embodiment of the present invention.

FIG. 7 is a schematic plan view of a thin-film transistor according to a third embodiment of the present invention, and FIG. 8 is a sectional view of the thin-film transistor taken in the direction perpendicular to the current flow. A sectional view taken in the direction parallel to current flow is substantially the same as that shown in FIG. 6(b) and is thus omitted. The semiconductor film of the thin-film transistor shown in FIG. 7 is separated into a plurality of portions by a plurality of intrinsic-semiconductor regions 14 that are disposed in parallel with a current 42 flowing between the source and the drain. This structure is suitable to reduce degradation over time which is caused by a high electric field strength and a high carrier concentration which occur at the end potions of the semiconductor film, thus releasing heat generated while the current flows. In addition, since the intrinsic-semiconductor region 14 is formed simply by doping a desired position or area with dopant, it does not require any additional space, and thus advantageously leads to a high-density arrangement of thin-film transistors. By using the thin-film transistor having this structure as a semiconductor device incorporated into circuits which serve as an essential component of various electrical products, such as liquid crystal panels, electroluminescent panels, and sensors, degradation of these circuits over time can be reduced. The circuits include, for example, transfer gates, inverters, clocked inverters, logic gates (NAND, NOR, and the like), shift registers, level shifters, buffer circuits, differential amplifiers, current mirror operational amplifiers, DA converters, AD converters, DRAMs, SRAMs, arithmetic circuit adders, microcomputers, DSPs, analog switches, and CPUs.

In this embodiment, the gate electrode 21 extends so as to cross the direction in which the current flows and to cover the ends of the semiconductor film, as shown FIG. 8. The gate electrode may be formed so as not to cover the outermost ends of the semiconductor film, and a sub gate electrode is formed to cover the ends of the semiconductor film instead of the gate electrode.

Figure 9:
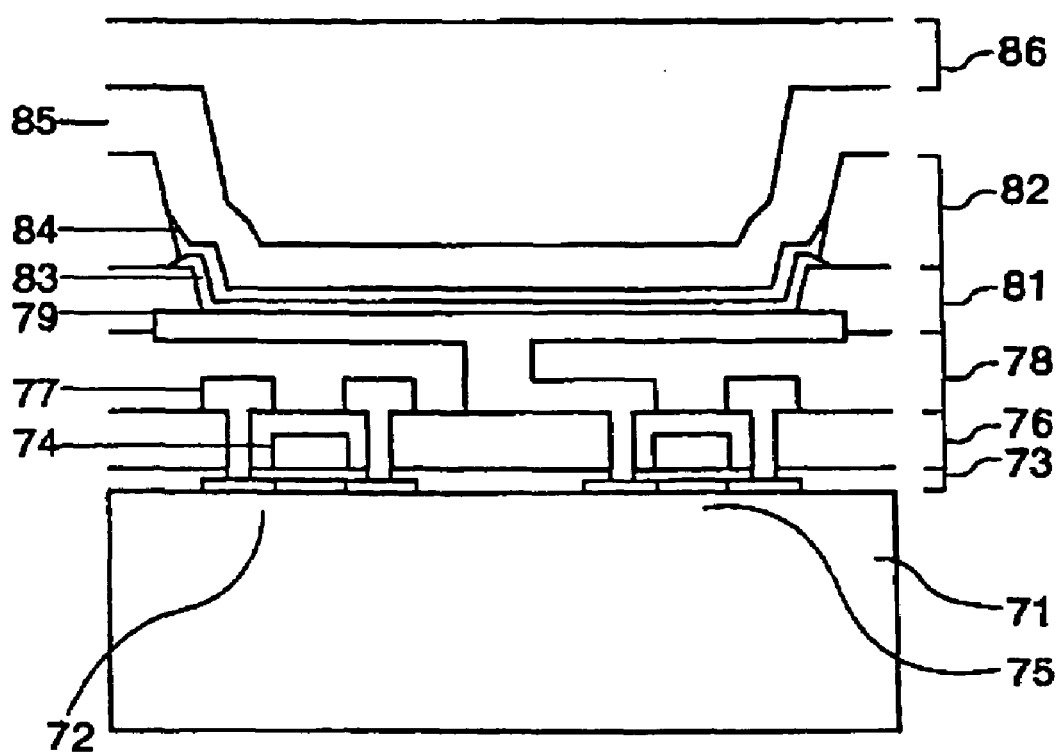
FIG. 9 is a cross-sectional view of an electro-optical device according to the present invention.

FIG. 9 is a sectional view that shows an organic electroluminescence device as an example of an electro-optical device of the present invention, in which an organic electroluminescence element is used as an electro-optical element. Thin-film transistors 72 and 75 are formed on an insulating substrate 71. A source or drain electrode 77, disposed on a first interlayer insulating film 76 which is connected to one thin-film transistor 75, but not to the other thin-film transistor 72, is connected to a pixel electrode 79 via a contact hole formed in a second interlayer insulating film 78. If the pixel electrode 79 is an anode formed of ITO or the like, it is preferable to provide a hole-injection layer 83 serving as a charge-injection layer on the pixel electrode 79, as described in this embodiment. The hole-injection layer 83 is provided with a luminescent layer 84 thereon. A cathode 85 is formed on the luminescent layer 84, and further, a sealant 86, to reduce, minimize or prevent water and oxygen from entering the cathode 85 and the luminescent layer 84, is disposed on the cathode 85. An adhesion layer 81 and an inter-layer 82 are provided at both sides of the luminescent layer 84 and the hole-injection layer 83.

If the hole-injection layer 83 and the luminescent layer 84 are formed by a liquid phase process, such as an ink-jet method or a micro spotting method, providing adhesion layer 81 lyophilic characteristics against the liquid used for the formation of the luminescent layer 84 and the hole-injection layer 83 different from those of the inter-layer 82 facilitates the formation of the hole-injection layer 83 and luminescent layer 84 so as to be selectively disposed in desired positions.

Figure 10:
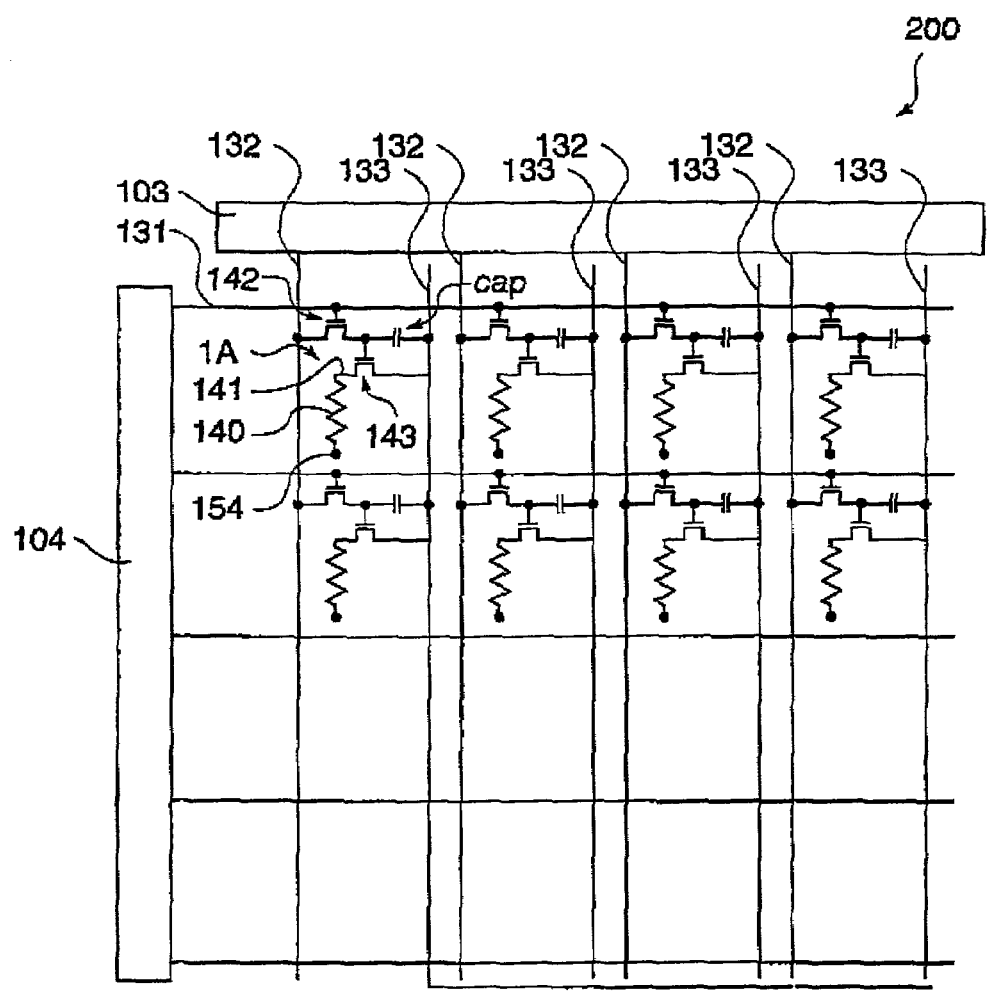
FIG. 10 is a schematic that shows a planar structure of the electro-optical device according to the present invention.

FIG. 10 is a schematic that shows an example of an active matrix display using organic electroluminescence elements including the semiconductor devices according to the present invention. The semiconductor devices serve to drive the electro-optical elements such as luminescent elements. FIG. 10 shows a display 200.

As shown in the circuit diagram in FIG. 10, the display 200 includes a plurality of scanning lines 131, a plurality of signal lines 132 extending in the direction crossing the scanning lines 131, and a plurality of common power feeding lines 133 extending parallel to the signal lines 132 disposed on the board. Intersecting points of the scanning lines 131 and the signal lines 132 define pixels (pixel areas) 1A.

A data driving circuit 103 is provided for the signal lines 132. On the other hand, a scanning driving circuit 104 is provided for the scanning lines 131. Each pixel area 1A has a first thin-film transistor 142 in which scanning signals are applied to the gate electrode thereof via a corresponding scanning line 131; a hold capacitor cap that holds a data signal transmitted from a corresponding signal line 132 via the first thin-film transistor 142; a second thin-film transistor 143 in which the data signal held by the hold capacitor cap is transmitted to the gate electrode thereof; a pixel electrode 141 into which driving current flows when it is connected to a corresponding common power feeding line 133 via the second thin-film transistor 143; and a luminescent element 140 disposed between the pixel electrode 141 and an opposing electrode 154.

In this structure, when the scanning line 131 is driven to switch the first thin-film transistor 142 on, the hold capacitor cap holds the potential of the signal line 132 at that moment. It is determined whether the second thin-film transistor 143 conducts according to the state of the hold capacitor cap. Current flows from the common power feeding line 133 to the pixel electrode 141 via the channel of the second thin-film transistor 143, and further to the opposing electrode 154 via the luminescent element 140. Thus, the luminescent element 140 emits light according to the amount of current flowing therethrough.

The semiconductor device according to the present invention can be used as the thin-film transistors 143 and 142. Also, the semiconductor device according to the present invention can be used as a component element of, for example, shift registers, level shifters, video lines, and switches, which are included in the data driving circuit 103 and the scanning driving circuit 104. In particular, the semiconductor device including a plurality of intrinsic-semiconductor regions, as shown in FIG. 9, is suitable for shift registers and level shifters in which a large amount of current may flow.

Figure 11:
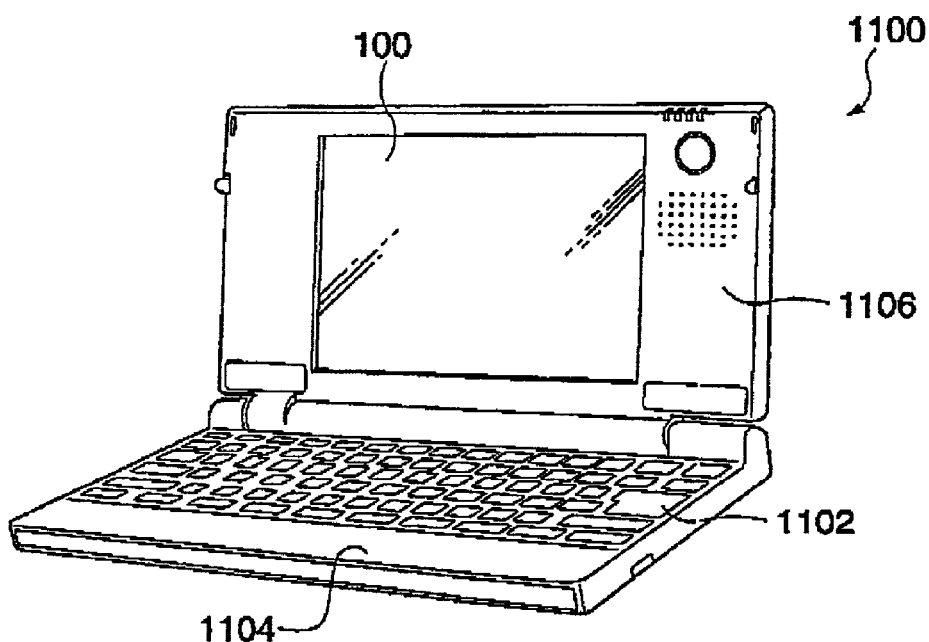
FIG. 11 is a perspective view showing an example of a mobile personal computer containing an electro-optical device according to the present invention.

Next, some examples of electronic apparatuses including the electro-optical device illustrated above will now be described. FIG. 11 is an oblique perspective view showing the structure of a mobile personal computer using the above electro-optical device. In FIG. 11, a personal computer 1100 includes a body 1104 including a keyboard 1102 and a display unit 1106. The display unit 1106 includes the electro-optical device 100 described above.

Figure 12:
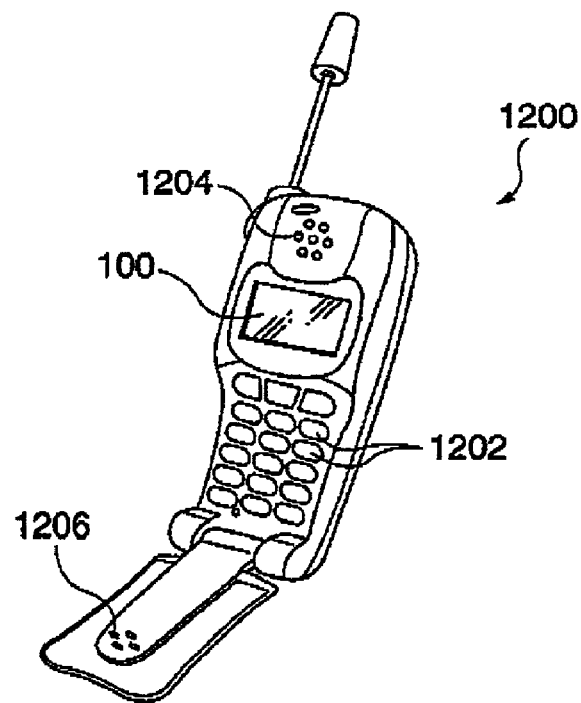
FIG. 12 is a perspective view showing an example of a cellular phone containing an electro-optical device according to the present invention.

FIG. 12 is an oblique perspective view of a cellular phone using the electro-optical device 100 for a display thereof. In FIG. 12, the cellular phone 1200 includes a plurality of operation buttons 1202, an earpiece 1204, a mouthpiece 1206, and the above electro-optical device 100.

Figure 13:
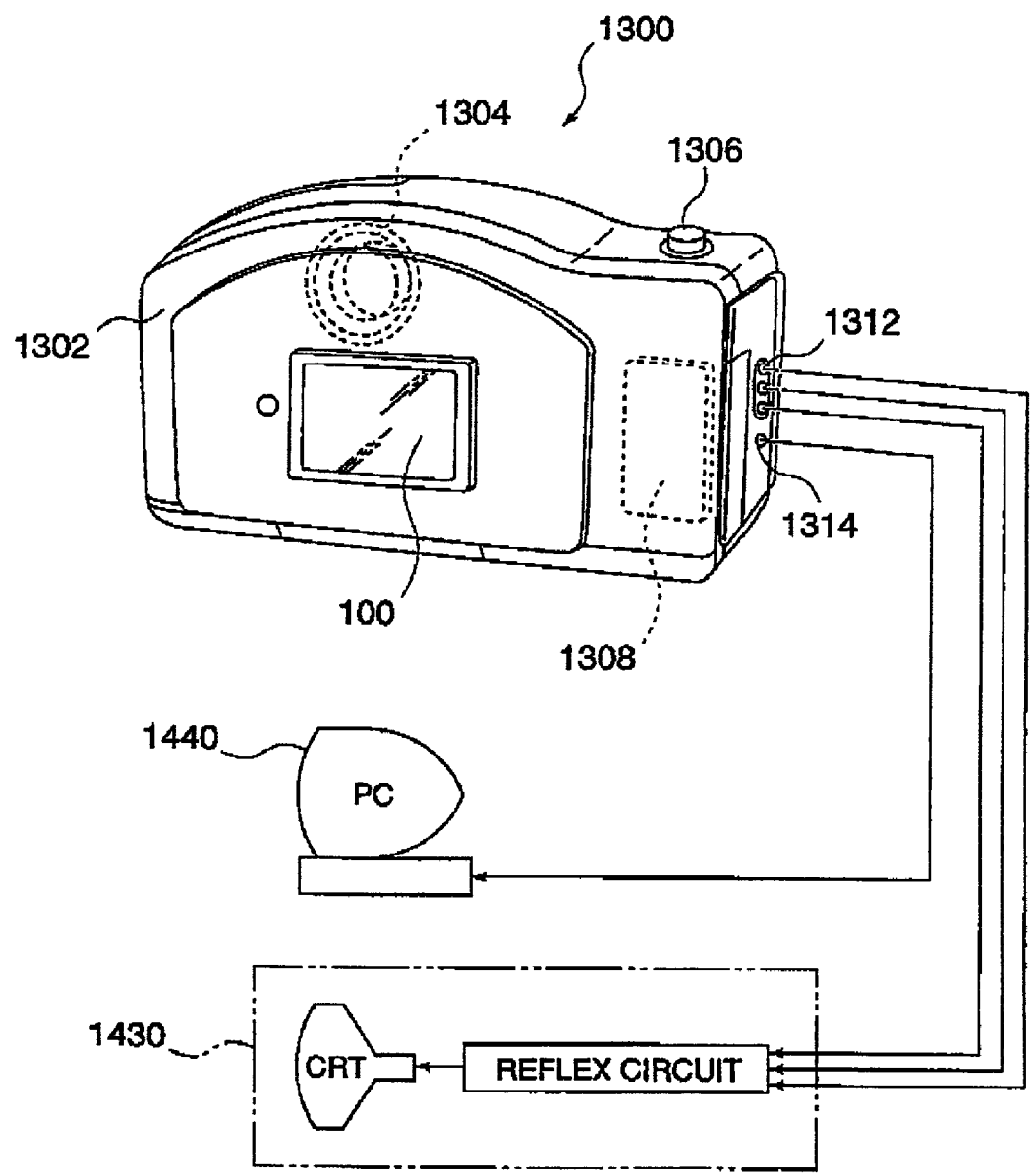
FIG. 13 is a perspective view and schematic showing an example of a digital still camera using an electro-optical device according to the present invention as the finder of the camera.

FIG. 13 is an oblique perspective view showing the structure of a digital still camera using the above electro-optical device 100 for a finder thereof. In FIG. 13, the connection with external equipment is also schematically shown. While film is exposed to optical images of objects in conventional cameras, in the digital still camera 1300, an imaging element, such as a CCD (charge coupled device) converts optical images of objects into electricity to generate imaging signals. The electro-optical device 100 is provided on the back of a case 1302 of the digital still camera 1300 to display images according to the imaging signals from the CCD. Thus, the electro-optical device 100 serves as a finder to display objects. Also, an optical receiver unit 1304 including a lens and the CCD is provided on the observing side of the case 1302 (back of the FIG. 13).

When a camera operator presses a shutter button 1306 after observing an object image displayed in the electro-optical device 100, the imaging signal from the CCD at that moment is transmitted to, and stored in, a circuit board 1308. Also, the digital still camera 1300 has a video-signal output terminal 1312 and an input-output terminal 1314 for data transmission on a side of the case 1302. If necessary, the video-signal output terminal 1312 is connected to a television monitor 1430 and the data transmission input-output terminal 1314 is connected to a personal computer 1440, as shown in FIG. 13. In addition, a certain operation allows the imaging signal stored in the memory storage of the circuit board 1308 to be output to the television monitor 1430 and the personal computer 1440.

Besides the personal computer shown in FIG. 11, the cellular phone shown in FIG. 12, and the digital still camera shown in FIG. 13, exemplary electronic apparatuses using the electro-optical device 100 of the present invention include, for example, TV sets, viewfinder-type and monitor-direct-view-type video tape recorders, car navigation systems, pagers, electronic notebooks, calculators, word processors, workstations, video phones, POS terminals, and apparatuses having touch panels. The electro-optical device 100, of course, can be used as the displays of these electronic apparatuses.

While the embodiments described above relate to polycrystalline silicon thin-film transistors, the technical concept of the present invention is effective in other semiconductor devices, such as, mono-crystalline silicon thin-film transistors, amorphous silicon thin-film transistors, and other thin-film transistors.

ADVANTAGES

The semiconductor device according to the present invention can be incorporated into various circuits. The circuits include, for example, transfer gates, inverters, clocked inverters, logic gates (NAND, NOR, and the like), shift registers, level shifters, buffer circuits, differential amplifiers, current mirror operational amplifiers, DA converters, AD converters, DRAMs, SRAMs, arithmetic circuit adders, microcomputers, DSPs, analog switches, and CPUs. By incorporating the semiconductor device according to the present invention into these circuits serving as essential components of various electronic products, such as liquid crystal panels, electroluminescence panels, and sensors, degradation of these circuits over time can be reduced.

The invention claimed is:

1. A semiconductor device, comprising:
   a semiconductor film having a source region and a drain region;
   a gate insulating film formed on at least part of the semiconductor film; and
   a gate electrode formed on the gate insulating film,
   a sub gate electrode connected to the gate electrode, and
   a width of the gate electrode being smaller than a width of the semiconductor film,
   the gate electrode not covering any end of the semiconductor film, and
   the sub gate electrode being disposed so as to cover at least one end of the semiconductor film and so as to cover at least an entire width of the gate electrode.

2. The semiconductor device according to claim 1, the sub gate electrode being disposed on the gate electrode.

3. The semiconductor device according to claim 1, the semiconductor film being formed on an insulating layer.

4. The semiconductor device according to claim 1, the width of the gate electrode being smaller than the width of the semiconductor film in the direction perpendicular to the source/drain direction.

5. A semiconductor device, comprising:
   a semiconductor film having a plurality of source regions and drain regions, the semiconductor film including a plurality of regions formed of an intrinsic semiconductor which is not doped with dopant;
   a gate insulating film formed on at least part of the semiconductor film; and
   a gate electrode formed on the gate insulating film;
   the regions extending toward at least one of the plurality of source regions and drain regions from the gate electrode and separating adjacent source regions and adjacent drain regions.

6. A semiconductor device, comprising:
   a semiconductor film having a source region and a drain region;
   a gate insulating film formed on at least part of the semiconductor film; and
   a gate electrode formed on the gate insulating film,
   a sub gate electrode connected to the gate electrode, and
   a width of the gate electrode being smaller than a width of the semiconductor film,
   the gate electrode not covering any end of the semiconductor film, and
   the sub gate electrode being disposed so as to cover at least one end of the semiconductor film and so as to cover at least an entire width of the gate electrode.

7. The semiconductor device according to claim 6, the width of the gate electrode being smaller than the width of the semiconductor film in the direction perpendicular to the source/drain direction.

* * * * *